United States Patent [19]
Samitsu et al.

[11] Patent Number: 5,877,088
[45] Date of Patent: Mar. 2, 1999

[54] FLATTENING METHOD AND APPARATUS FOR SEMICONDUCTOR DEVICE

[75] Inventors: Yamato Samitsu; Hirohiko Izumi, both of Tokyo, Japan

[73] Assignee: Nippon Steel Corporation, Tokyo, Japan

[21] Appl. No.: 745,289

[22] Filed: Nov. 8, 1996

[30] Foreign Application Priority Data

Nov. 10, 1995 [JP] Japan ................................ 7-317343

[51] Int. Cl.⁶ .................................................. H01L 21/00
[52] U.S. Cl. ........................... 438/692; 156/345; 216/38; 216/84; 216/88
[58] Field of Search ...................... 156/345 LC, 345 LP; 438/8, 14, 692; 216/38, 84, 85, 88

[56] References Cited

U.S. PATENT DOCUMENTS 4,793,895  12/1988  Kaanta ........................... 156/345 LC

FOREIGN PATENT DOCUMENTS

A-2-257630   10/1990  Japan .
A-4-53671     2/1992  Japan .
A-6-315850 A 11/1994  Japan .

*Primary Examiner*—William Powell
*Attorney, Agent, or Firm*—Pollock, Vande Sande & Priddy

[57] ABSTRACT

When the surface of a semiconductor device having at least two different films formed on a substrate is flattened by chemical mechanical polishing, the abrasion resistance upon polishing is detected by strain gauges provided close to the surface of the semiconductor device to be polished. In addition, the end of the polishing process is determined on the basis of the amount of change of the detected signals produced from the strain gauges.

41 Claims, 7 Drawing Sheets

FIG.10

FLATTENING METHOD AND APPARATUS FOR SEMICONDUCTOR DEVICE

BACKGROUND OF THE INVENTION

1. Field of the Invention

The present invention relates to flattening method and apparatus for semiconductor device, and particularly to a flattening method and apparatus with the improved precision of detecting (or determining) a polishing end point for polishing the surface of semiconductor device.

2. Description of the Related Art

Recently, as the elements in the semiconductor device have been highly integrated and fine patterned, the multi-layering technique such as polycrystalline silicon wiring has been progressed to realize faster operation and higher electric performance of the semiconductor device. In the manufacturing process for semiconductor device, when an irregular portion, or uneven level is produced on the surface of the silicon wafer substrate with a lower wiring conductor formed thereon (which is hereinafter referred to as "device wafer"), an upper wiring conductor formed on the surface of the device wafer may cause a short circuit between the conductors or the control of focusing on the surface of the device wafer upon exposure may be difficult in a fine patterning operation such as photolithography process.

In the prior art, the surface of the device wafer is flattened by CMP (Chemical Mechanical Polishing). However, in order to assure a suitable degree of polishing or correct depth of polishing, it is necessary to precisely determine a polishing end point which means the time or timing when the polishing process ends.

A polishing end point detector disclosed in JP-A-6-315850 measures the torque of at least one of the first shaft for driving the polishing table, on which an object to be polished such as a silicon wafer is placed, and the second shaft for rotating the polished object, and then detects that at least one of the measured torque and the differentiated value of the measured torque with respect to time has changed to a predetermined value or above, thus producing a polishing end signal which determines the polishing end point.

In this conventional polishing end deciding method based on the torque change of the shaft, the information for the decision is obtained from the torque change over the entire wafer, and thus the decision is not always exact. In other words, it is uncertain if a torque change in the shaft is caused by part of the wafer or by the entire wafer, and hence such decision is unavoidably macroscopic and rough.

Other conventional polishing methods as given below are disclosed which employ a strain gauge helpful for precisely polishing the surface of semiconductor device.

(1) Semiconductor substrate polishing control method in JP-A-2-257630

During polishing, the amount of deformation of the lower surface of a holder which supports and presses a semiconductor substrate thereon is measured by a strain gauge, and the upper and lower portions of the holder are held at different temperatures in proportion to the measured amount of deformation, thereby regulating the surface shape of the lower surface of the holder. In addition, during polishing, the amount of deformation of the polishing cloth (or the abrasive cloth) is measured by a displacement meter, and the temperature of the polishing liquid (or the abrasive liquid) poured on the polishing cloth is determined in accordance with the measured amount of deformation, thereby regulating the surface shape of the polishing cloth. Moreover, the amount of deformation of the lower table with the polishing cloth attached on the surface is measured by the displacement meter, and the upper and lower portions of the lower table are held at different temperatures according to the measured amount of deformation, thereby regulating the surface shape of the lower table.

(2) Heat deformation control type surface polishing method in JP-A-4-53671

A plurality of heaters and a plurality of strain gauges are provided on the opposite surface to the polishing side of the upper table, and the heaters are turned on and off in accordance with the amount of deformation of the upper table measured by the strain gauges during polishing, thereby stabilizing the deformation of the upper table due to heat.

However, none of the two conventional methods given above improves the precision in determining the polishing end point by use of strain gauges.

SUMMARY OF THE INVENTION

It is an object of the present invention to provide a semiconductor flattening method and apparatus with the improved precision with which the polishing end point is determined while the surface of the semiconductor device is polished.

According to the present invention, there is provided a method of flattening, by chemical mechanical polishing, a surface of a semiconductor device that has at least two different films formed on a substrate, comprising the steps of detecting abrasion resistance upon polishing by a strain gauge provided close to a polished surface, and deciding an end of a polishing process on the basis of an amount of change of a detected signal produced from the strain gauge.

According to the present invention, there is also provided a flattening apparatus for flattening, by chemical mechanical polishing, a surface of a semiconductor device that has at least two different films formed on a substrate, wherein the semiconductor device is placed at a certain location on a rotating table through an polishing cloth, and driven to rotate, at least one strain gauge is buried close to a polished surface of the semiconductor device, and a polishing end point of the polished surface of the semiconductor device is determined by a processor for processing an output signal from the at least one strain gauge.

DESCRIPTION OF THE PREFERRED EMBODIMENTS

Figure 1:
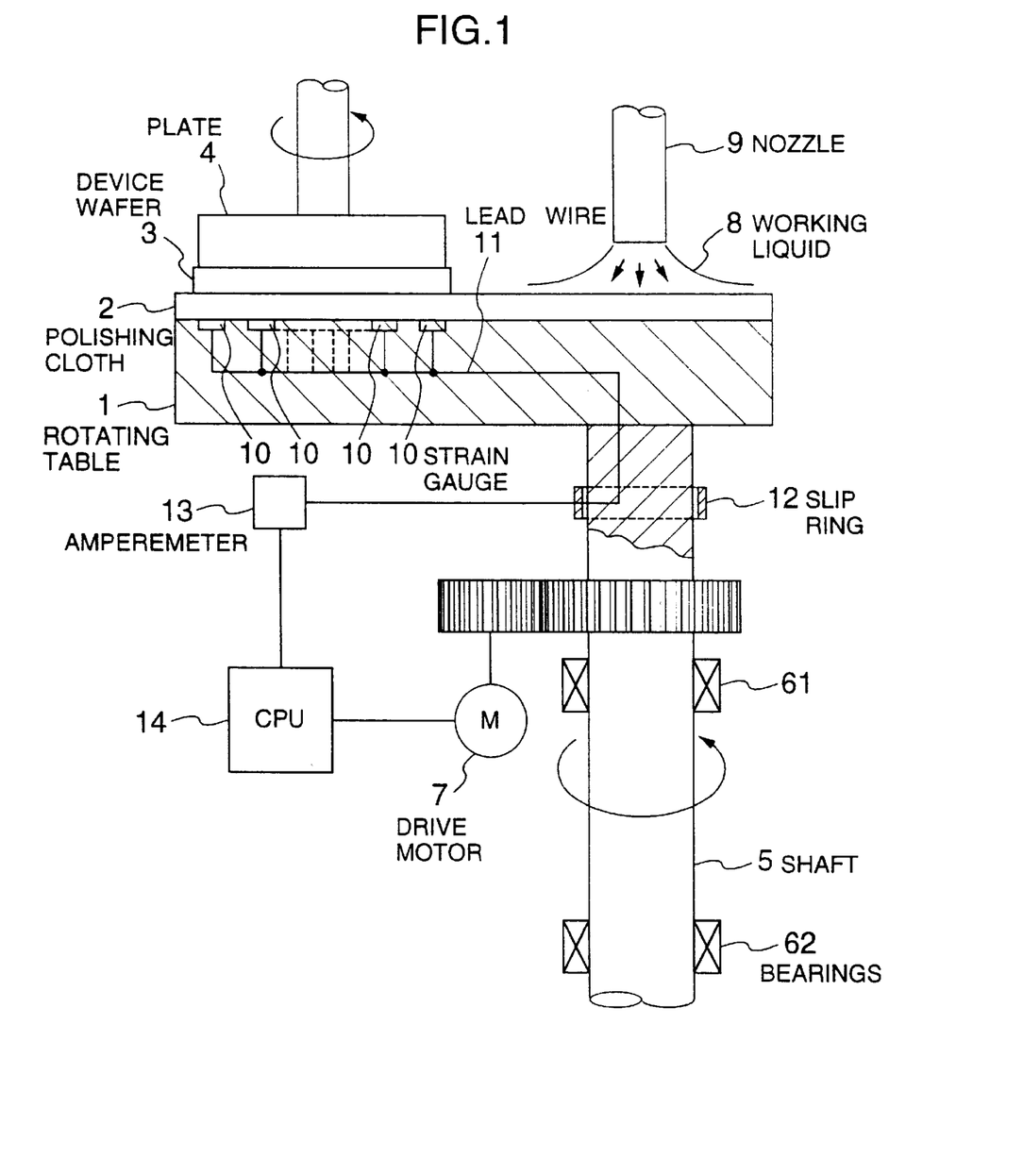
FIG. 1 is a partially cross-sectional diagram of the construction of a semiconductor flattening apparatus according to the first embodiment of the present invention.

Referring to FIG. 1, a semiconductor device flattening apparatus of the first embodiment of the present invention has a rotating table 1 made of a material such as artificial stone or stainless steel, a polishing cloth (or an abrasive cloth) 2, a plurality of plates (only the single plate 4 is shown in FIG. 1) 4, a rotating shaft 5, a plurality of bearings $6_1$, $6_2$, a drive motor 7, a nozzle 9, a plurality of strain gauges 10, a slip ring 12 provided around the shaft 5, an amperemeter 13 electrically connected to the slip ring 12, and a central processing unit (hereinafter, referred to as "CPU") 14 electrically connected to the amperemeter 13 and to drive motor 7.

The rotating table 1 is connected to the shaft 5 and supported on the bearings 6 so as to be rotatable with the shaft, and the drive motor 7 drives the rotating table 1 to rotate through the shaft 5. The polishing cloth 2 is stuck on the top of the rotating table 1. The plurality of plates 4 are provided above the rotating table 1 along its outer periphery at certain intervals, and to be rotatable. A device wafer 3 to be polished is caused to fixedly adhere by, for example, vacuum suction to the rotating table 1 side of each of the plates 4, and each of the device wafers 3 is pressed against the polishing cloth 2 on the rotating table 1 by each of the plates 4.

The nozzle 9 is provided above the rotating table 1 and to be close there to at around its center, and spits out a working liquid 8 for use in polishing the surface of the device wafer 3. This working liquid 8 may be preferably, for example, a solution of potassium hydroxide mixed with colloidal silica. In the polishing process, the rotating table 1 is rotated by the drive motor 7, while the working liquid 8 is supplied forth from the nozzle 9. At this time, the surface of the device wafer 3 contacted with the polishing cloth 2 can be polished by the chemical action of potassium hydroxide and the mechanical action of colloidal silica.

Each of the strain gauges 10 is electrically connected to the slip ring 12 through a lead wire 11. The output signal from each of the strain gauges 10 is supplied to the CPU 14 through the lead wire 11, slip ring 12 and amperemeter 13. The CPU 14 functioning as a signal processing control unit controls the drive motor 7 to stop and rotate according to the output signal from each of the strain gauges 10.

Figure 2:
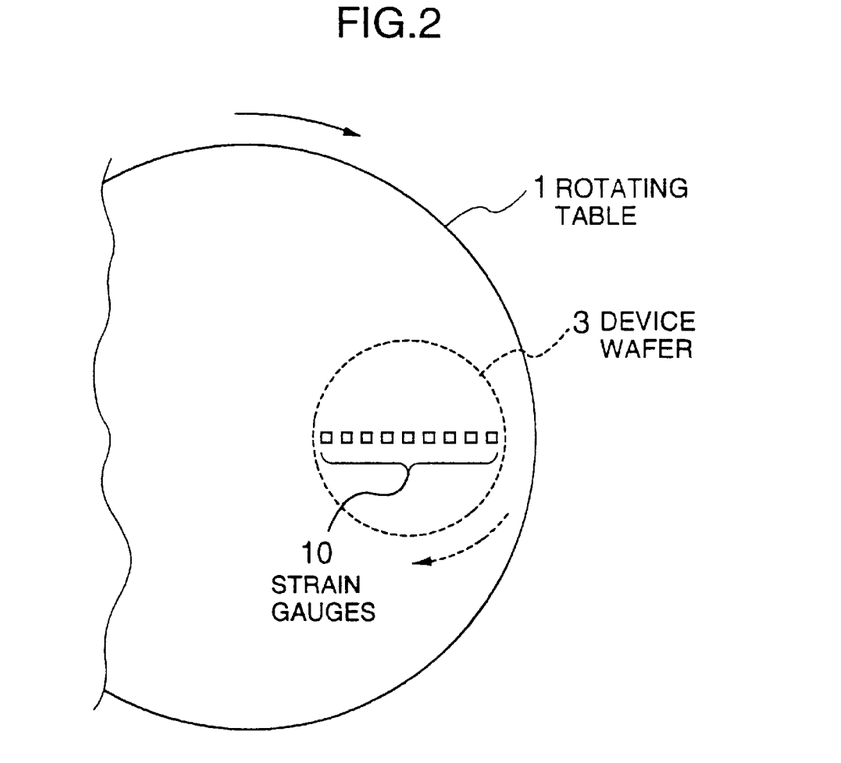
FIG. 2 is a plan view of a rotating table and strain gauges provided on the rotating table as shown in FIG. 1.

The plurality of strain gauges 10, as shown in FIGS. 1 and 2, are linearly arranged and buried in the surface portion (close to the polished surface of the device wafer 3) of the rotating table 1 at a single location along the outer periphery of the rotating table 1 so that when one of the device wafers 3 comes just above these strain gauges 10, the diameter of that device wafer 3 lies exactly on the line of strain gauges 10. FIG. 2 shows nine strain gauges 10 arranged in line. If the strain gauges 10 are arranged at intervals of about 10 mm for the device wafer 3 having a diameter of 6 inches, the number of the strain gauges 10 is 13.

Figure 3:
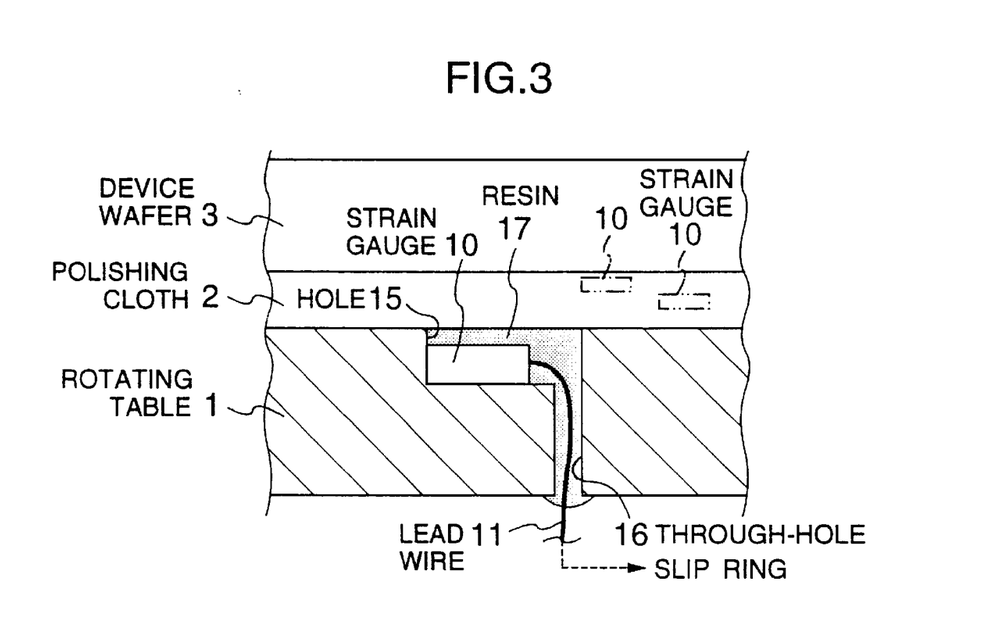
FIG. 3 is a partial cross-sectional view showing an example of mounting the strain gauges in the rotating table shown in FIG. 1.

The strain gauges 10 are buried in the surface portion of the rotating table 1 as, for example, indicated in FIG. 3 by the solid line. The rotating table 1 is bored by a drill or the like at certain locations in its surface to form holes 15 in which the strain gauges 10 are mounted. In addition, through-holes 16 are formed in the rotating table 1 by drilling or the like so that the lead wires 11 to be connected to the strain gauges 10 can be extended therethrough to the slip ring 12. The strain gauges 10 are set in the holes 15, and one end of the lead wires 11 inserted through the through-holes 16 is connected to the strain gauges 10. Then, the strain gauges 10 and the lead wires 11 are sealed and fixed with resin material 17.

A description will be made of how to polish the surface of the device wafer 3 having a cross-section shown in FIG. 4A by use of this semiconductor device flattening apparatus.

Figure 4A:
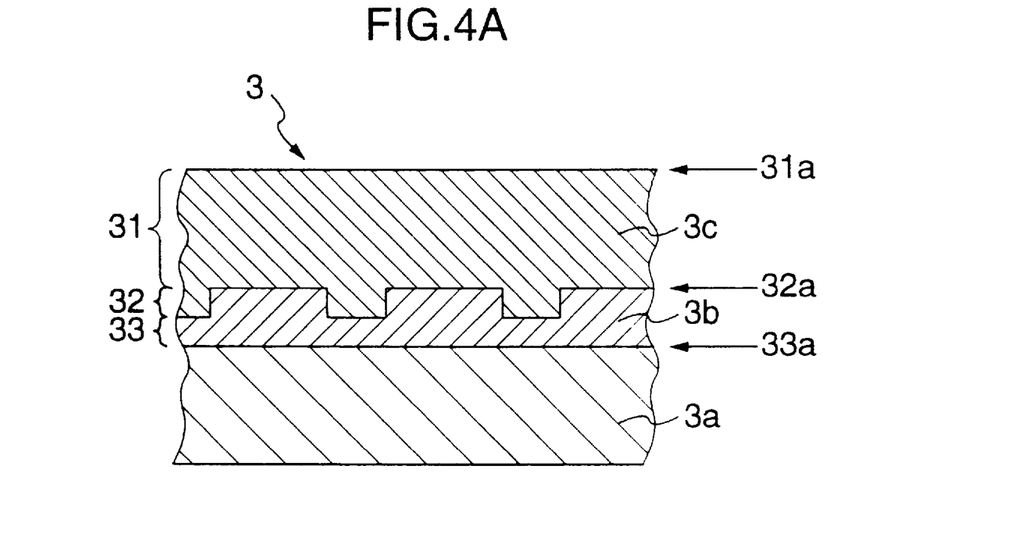
FIG. 4A is a cross-sectional view of an example of the construction of the device wafer shown in FIG. 1.

The device wafer 3, as shown in FIG. 4A, includes a substrate 3a, an oxide film 3b formed on the substrate 3a and having an irregular surface, and a polysilicon film 3c formed on the oxide film 3b. Here, for the convenience of explanation, a first layer 31 is assumed to be the region from the surface 31a of the polysilicon film 3c to the level of a boundary 32a between the polysilicon film 3c and the top of the projections of the irregular surface of the oxide film 3b, a second layer 32 is to be the region from the boundary 32a to the bottom of the depressions of the irregular surface of the oxide film 3b, and a third layer 33 to be the region from the bottom 33a of the depressions of the oxide 3b to the surface of the substrate 3a. In this case, the first layer 31 made of only the polysilicon film 3c is relatively hard, the third layer made of only the oxide film 3b is relatively soft, and the second layer 32 made of polysilicon film 3c and oxide film 3b has about an intermediate hardness between those of the first layer 31 and the third layer 33.

The polishing process for the surface of the device wafer 3 is started from the surface 31a of the first layer 31 by rotating the rotating table 1 and spouting the working liquid 8 from the nozzle 9. During this polishing process, a friction force is produced between the polishing cloth 2 and the device wafer 3. The magnitude of the so-called abrasion resistance caused on the basis of this friction force depends substantially upon the hardness of the polished substance (in this case, the polysilicon film 3c of the first layer 31). The abrasion resistance acts on the strain gauges 10 buried in the rotating table 1. Therefore, the deformation of the strain gauges 10 is increased in proportion to the abrasion resistance. At this time, the torque of the drive motor 7 can also be detected from the output signals that are supplied from the strain gauges 10 through the slip ring 12 to the CPU 14.

Figure 4B:
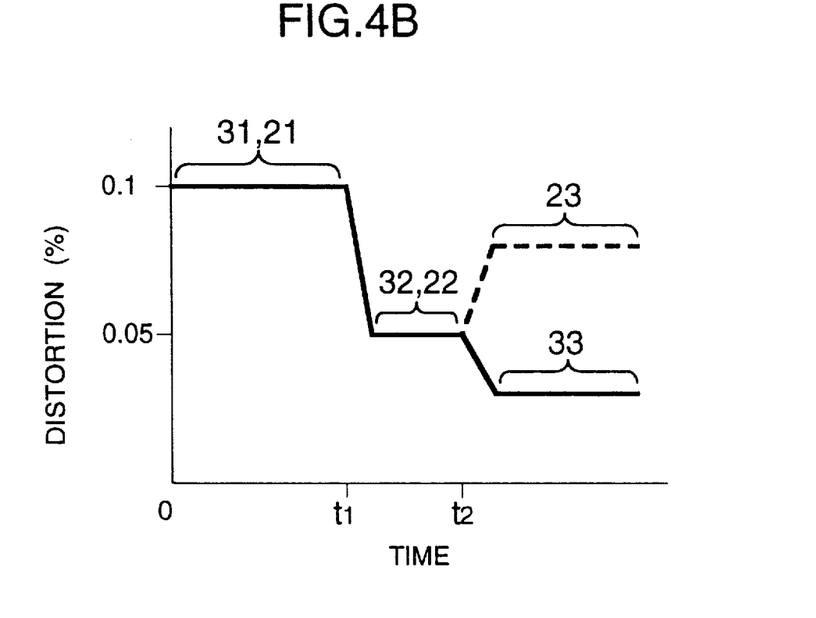
FIG. 4B is a graph showing one example of the change of the output signal from the strain gauges shown in FIG. 1.

FIG. 4B shows the change of the amount of distortion of the strain gauge 10 with respect to time when the device wafer 3 illustrated in FIG. 4A is polished from the surface 31a of the first layer 31 to part of the third layer 33. From FIG. 4B, it will be obvious that when the first layer 31 of only polysilicon film 3c is polished the deformation of the strain gauge 10 is as large as 0.1% since the polysilicon film 3c is relatively hard. When the polishing process reaches the boundary 32a between the first layer 31 and the second layer 32 and enters into the operation for the second layer 32, the abrasion resistance is decreased to be less than in the first layer 31 made of only polysilicon film 3c since the second layer 32 partially contains the soft oxide film 3b. As a result, the amount of distortion of the strain gauge 10 is reduced to 0.05% (time $t_1$). Thereafter, when the polishing process is advanced to the bottom 33a of the depressions of the surface of the oxide film 3b and started to polish the third layer 33, the abrasion resistance is further reduced as compared with that in the second layer 32 since the third layer 33 is made of only the soft oxide film 3b. Accordingly, the distortion of the strain gauge 10 is changed down to 0.03% (time $t_2$).

Therefore, when the device wafer 3 is polished, the amount of polishing or depth of polishing can be detected from the change of the output signal at the boundary between the different-hardness layers or films which output signal is fed from the strain gauge 10 to the CPU 14. In other words, the relation between the output signal (amount of distortion) of the strain gauge 10 and the amount of polishing in the device wafer 3 is previously stored in the CPU 14, and the actual output signal fed from the strain gauge 10 upon polishing is compared with the data stored in the CPU 14 so that the current amount of polishing can be known.

In addition, since this semiconductor flattening apparatus has a plurality of strain gauges 10 arranged in alignment with the diameter of each device wafer 3, the amounts of deformation of the device wafer 3 at a plurality of different locations can be measured at a time by the strain gauges 10. Thus, it is possible to precisely detect the amounts of polishing uniformly over the entire surface of the device wafer 3. This can lead to a high-precision flattening process.

One example of polishing will be mentioned in which the end of polishing is at the boundary 32a between the polysilicon film 3c and the top of the projections of the irregular surface of the oxide film 3b. When all the amounts of distortion of the strain gauges 10 are detected to have arrived at 0.05% or below as rotation of the end of polishing, the drive motor 7 is stopped. At this time, the degree of the exposure of the oxide film 3b to the outside is measured by a film thickness meter. From the measured results, it was confirmed that the polysilicon film 3c in each of 190 chips of 200 chips was insulated by the oxide film 3b (that is, the polysilicon film 3c remained buried in the oxide film 3b of the second layer 32).

A semiconductor device flattening apparatus of the second embodiment of the present invention will be described below. Although the flattening apparatus of the first embodiment has the strain gauges 10 buried in the surface portion of the rotating table 1 as shown in FIG. 3 by the solid line, the strain gauges 10 may be buried in the surface portion or intermediate portion of the polishing cloth 2 as shown in FIG. 3 by two-dot chain lines. In this case, because the strain gauges 10 are disposed closer to the polished surface of the device wafer 3, the abrasion resistance during polishing can be more accurately detected, and thus the polishing end point can be detected with high accuracy.

Figure 5:
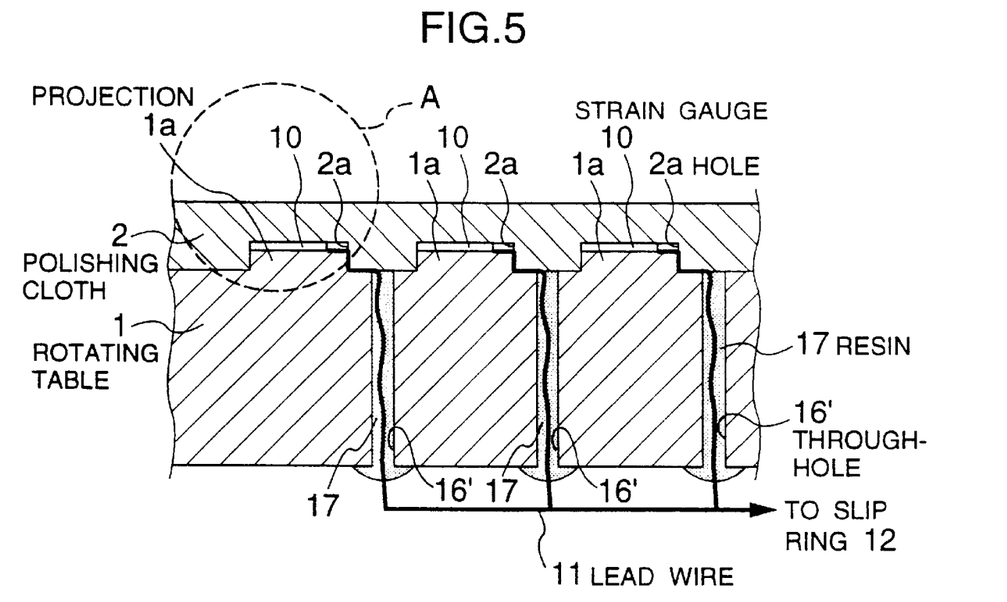
FIG. 5 is a partial cross-sectional view of a specific example of the construction of the semiconductor device flattening apparatus according to the second embodiment of the present invention, showing the way to mount the strain gauges.

FIG. 5 shows a specific example of the way to bury the strain gauges 10 in the polishing cloth 2. In this example, the surface of the rotating table 1 is made irregular to have projections and depressions, and the strain gauges 10 are buried in the thickness-wise intermediate portion of the polishing cloth 2. In other words, the projections 1a on which the strain gauges 10 are mounted are formed in the surface of the rotating table 1, and the holes 2a opposite to the projections 1a are formed in the lower side of the polishing cloth 2. After the strain gauges 10 are mounted on the projections 1a of the rotating table 1, the polishing cloth 2 is stuck on the surface of the rotating table 1 so that the strain gauges 10 can be buried in the thickness-wise intermediate portion of the polishing cloth 2.

The lead wires 11 with one end connected to the strain gauges 10 are laid in the escape grooves 1b that are engraved in the surface of the rotating table 1 from the shoulders of the projections 1a to the mouths of through-holes 16' formed in the rotating table 1. Then, they are passed through the through-holes 16', and further extended to the slip ring 12. The lead wires 11 within the through-holes 16' are enclosed and fixed with the resin material 17. Since the lead wires 11 are laid in the escape grooves 1b, the lead wires 11 can be prevented from overhanging on the surface of the rotating table 1. Thus, the strain gauges 10 and the slip ring 12 can be properly connected through the lead wires 11.

Figure 7:
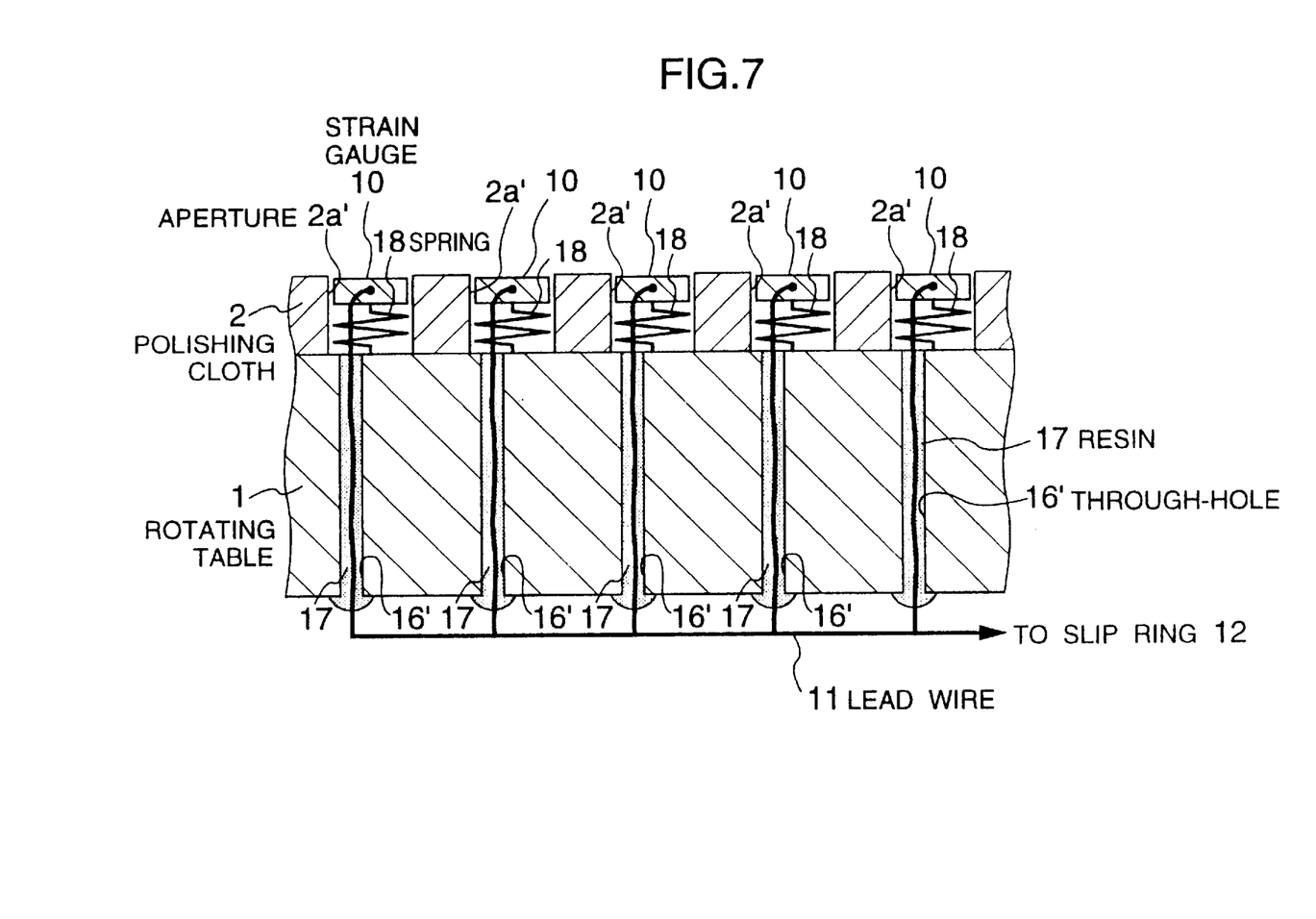
FIG. 7 is a cross-sectional view shown in another example of the way of mounting the strain gauges in the semiconductor device flattening apparatus according to the second embodiment of the present invention.

With reference to FIG. 7, a description will be made of a specific example in which the strain gauges 10 are mounted in the surface of the polishing cloth 2. Apertures 2a' are formed through the polishing cloth 2 at the locations where the strain gauges 10 are to be provided. Springs 18 with one end secured to the surface of the rotating table 1 are provided within the apertures 2a'. The strain gauges 10 are mounted on the other ends of the springs 18 so that they can be elastically supported by the springs 18. The lead wires 11 with one end connected to the strain gauges 10 are passed through the apertures 2a' of the polishing cloth 2 and through the through-holes 16' provided in the rotating table 1, and further extended to the slip ring 12. The lead wires 11 within the through-holes 16' are sealed and fixed with the resin material 17.

Figure 6:
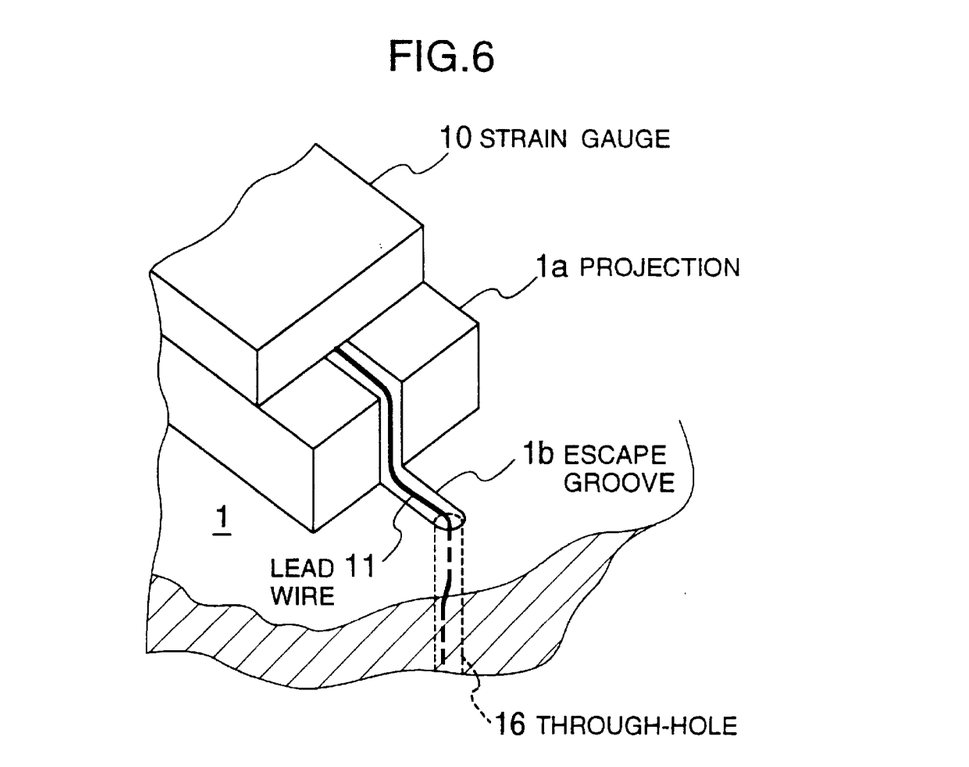
FIG. 6 is a magnified perspective view of a region A, as indicated by a broken line, of the construction shown in FIG. 5.

In this example, since the strain gauges 10 are exposed from the apertures 2a' of the polishing cloth 2 and directly contacted with the polished surface of the device wafer 3, the strain gauges 10 can be provided nearer to the polished surface than in the example shown in FIG. 6. Thus, it is possible to raise the precision with which the polishing end point can be determined by use of the strain gauges 10.

Figure 8:
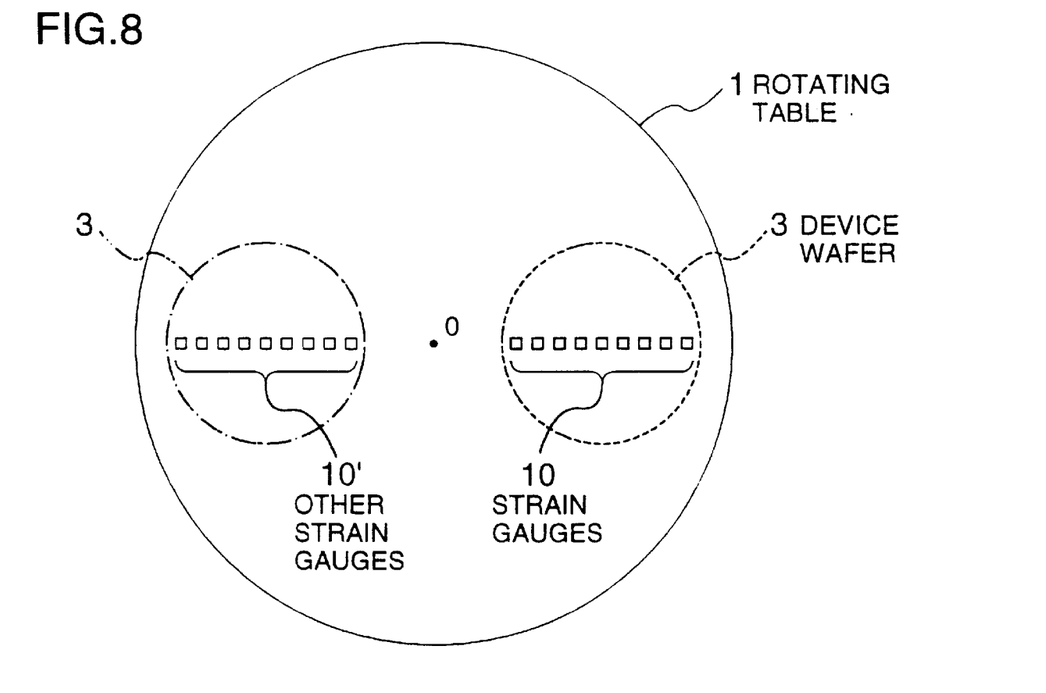
FIG. 8 is a plan view showing an example of the arrangement of the strain gauges provided in the rotating table of the semiconductor device flattening apparatus according to the third embodiment of the present invention.

The semiconductor device flattening apparatus of the third embodiment of the present invention will be described with reference to FIG. 8. It is previously described that in the flattening apparatus of the first embodiment, the plurality of strain gauges 10 are buried in the surface portion of the rotating table 1 at a single location along its outer periphery as shown in FIG. 2 so that when one of the device wafers 3 comes just above these strain gauges 10, the diameter of that device wafer 3 can be aligned with the line of the strain gauges 10. In the flattening apparatus of the third embodiment, another set of strain gauges 10' is provided in addition to the strain gauges 10 shown in FIG. 2. That is, as shown in FIG. 8, a plurality of strain gauges 10' are buried in the surface portion of the rotating table 1 along its outer periphery at a different location symmetrical to the strain gauges 10 with respect to the center O of the rotating table 1.

According to the flattening apparatus of the third embodiment, since a set of strain gauges 10 and another set of strain gauges 10' are provided to be aligned with the diameter of the device wafer 3, the output signals can be produced from both sets of the strain gauges 10, 10' which face a large number of locations on the device wafer 3. Consequently, the device wafer 3 can be flattened with high precision.

A description will be made of one example of polishing the device wafer 3 shown in FIG. 4A in which the polishing process ends at the boundary 32a between the polysilicon film 3c and the top of the projections of the irregular surface of the oxide film 3b. The polishing end point was set to the time point when all the amounts of distortion of the strain gauges 10 and the other strain gauges 10' reach 0.045%, and the drive motor 7 was stopped when the polishing end point was detected. The degree of the exposure of the oxide film 3b was measured by a film-thickness meter. From the measured results, it was confirmed that the polysilicon film 3c in all the 200 examined chips was insulated by the oxide film 3b (that is, the polysilicon film 3c stayed buried in the oxide film 3b of the second layer 32).

Figure 9:
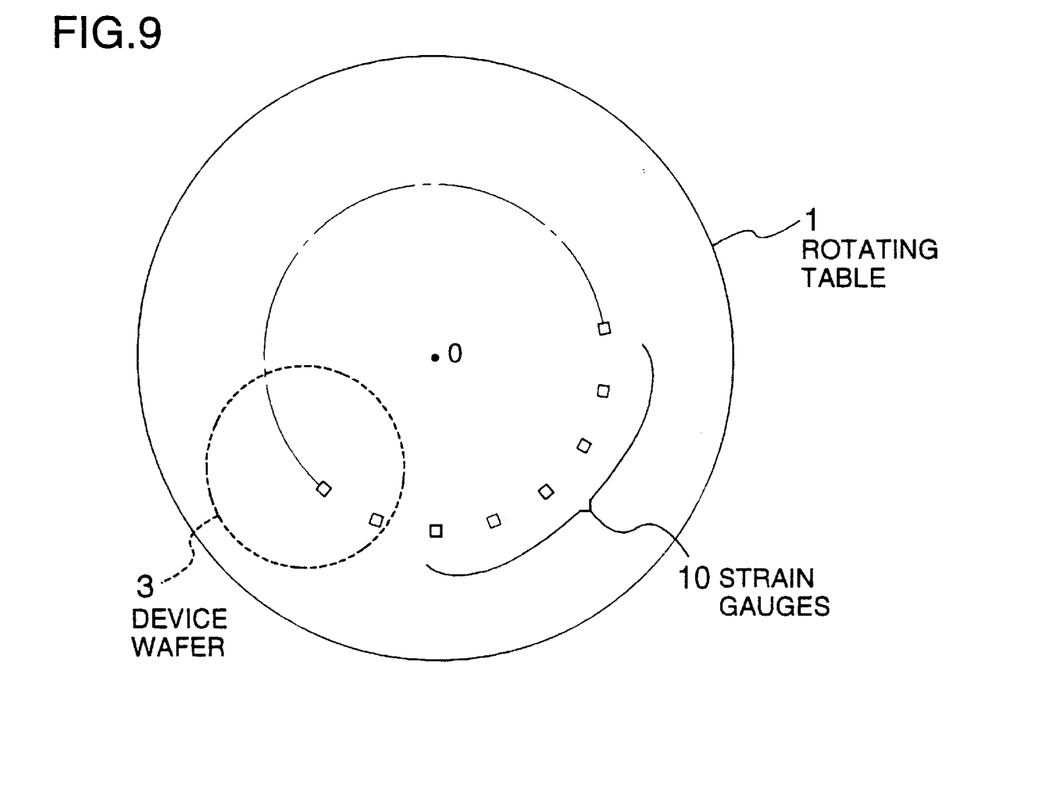
FIG. 9 is a plan view showing an example of the arrangement of the strain gauges provided in the rotating table of the semiconductor device flattening apparatus according to the fourth embodiment of the present invention.

A semiconductor device flattening apparatus of the fourth embodiment of the present invention will be described with reference to FIG. 9. The flattening apparatus of this embodiment is different from that of the first embodiment in that a plurality of strain gauges 10 are buried in the surface portion of the rotating table 1 along the circumference of the rotating table 1. Preferably, the strain gauges 10 buried in the surface portion of the rotating table 1 are disposed in the direction in which the center of the device wafer 3 moves that is relatively revolved around the center O of the rotating table 1 as the rotating table 1 rotates.

In the flattening apparatus of this embodiment, since the plurality of strain gauges 10 are disposed along the circumference of the rotating table 1, the polishing end point can be surely determined even if a shock or vibration occurs on the rotating table 1.

A description will be made of one example of polishing the device wafer 3 shown in FIG. 4A in which the polishing process ends at the boundary 32a between the polysilicon film 3c and the top of the projections of the irregular surface of the oxide film 3b. The polishing end point was set to the time point when all the amounts of distortion of the strain gauges 10 reach 0.05% and the drive motor 7 was stopped when the polishing end point was detected. The degree of the exposure of the oxide film 3b was measured by a film-thickness meter. From the measured results, it was confirmed that the polysilicon film 3c in all the 200 examined chips was insulated by the oxide film 3b (that is, the polysilicon film 3c stayed buried in the oxide film 3b of the second layer 32).

Another structure of the device wafer that can be flattened by use of the semiconductor device flattening apparatus of the present invention will be described with reference to FIG. 10.

Figure 10:
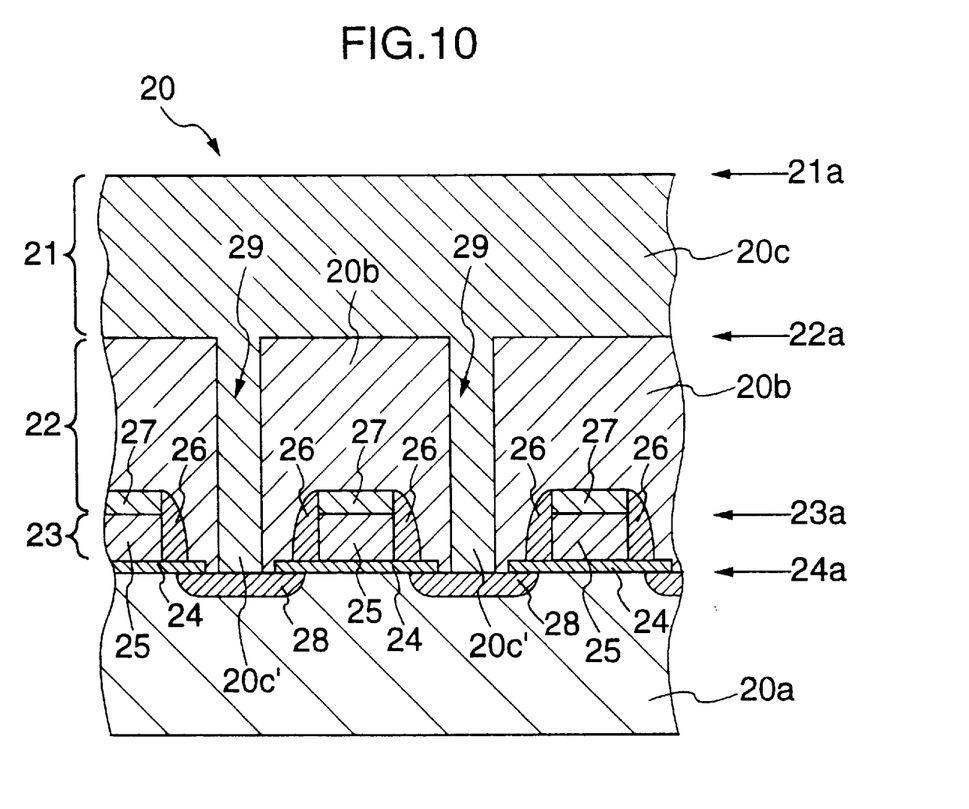
FIG. 10 is a cross-sectional view of another example of the construction of the device wafer the surface of which can be flattened by the flattening apparatus according to the present invention.

A device wafer 20 shown in FIG. 10 is MOS transistors including a silicon substrate 20a, impurity diffusion regions 28 that are formed in the silicon substrate 20a and function as sources or drains, gate wiring conductors 25 formed on gate oxide films 24 that are deposited on the silicon substrate 20a, side walls 26 formed on the sides of the gate wiring conductors 25, cap oxide films 27 formed on the tops of the gate wiring conductors 25, an oxide film 20b deposited on the silicon substrate 20a over the gate wiring conductors 25, and a polysilicon film 20c formed on the oxide film 20b. The oxide film 20b has through-holes 29 provided to reach the impurity diffusion regions 28 and filled with the polysilicon film 20c.

Here, for the convenience of explanation, the region from the surface 21a of the polysilicon film 20c to the boundary 22a between the polysilicon film 20c and the top of the oxide film 20b is referred to as the first layer 21, the region from the boundary 22a to the tops 23a of the gate wiring conductors 25 as the second layer 22, and the range from the tops 23a of the gate wiring conductors 25 to the top 24a of the silicon substrate 20a as the third layer 23. In this case, the first layer 21 made of only the polysilicon film 20c is relatively hard, the second layer 22 made of the oxide film 20b, cap oxide films 27, part of the side walls 26 and part 20c' of the polysilicon film 20c within the through-holes 29 is relatively soft, and the third layer 23 made of part 20c' of the polysilicon film 20c within the through-holes 29, gate wiring conductors 25, other part of the side walls 26, gate oxide films 24 and the oxide film 20b has an intermediate hardness between those of the first layer 21 and the second layer 22.

The broken line in FIG. 4B shows the amount of distortion of the strain gauge 10 with respect to time when the device wafer 20 is polished up to part of the third layer 23. That is as shown in FIG. 4B, when the first layer 21 made of only the polysilicon layer 20c is polished, the amount of distortion of the strain gauge 10 is as large as 0.1% since the polysilicon film 20c is relatively hard. Then, when the second layer 22 is started to be polished after the polishing process is progressed to the boundary 22a between the first layer 21 and the second layer 22, the abrasion resistance is decreased as compared with that in the first layer 21 made of only the polysilicon film 20c since the second layer 22 partially includes the soft oxide film 20b. As a result, the strain gauge 10 indicate a small amount of distortion, 0.05%. When the polishing process is further progressed up to the tops 23a of the gate wiring conductors 25 at which the third layer 23 is started to be polished, the abrasion resistance is increased as compared with that in the second layer 22 since the third layer 23 partially includes the gate wiring conductors 25 made of the hard polysilicon film. Consequently, the amount of distortion of the strain gauge 10 is again increased to 0.08%. In this case, however, it never exceeds the value of 0.1% which the strain gauge 10 indicate when the first layer 21 of only the polysilicon film 20c is polished. In an example of the actual polishing process for the device wafer 20, polishing is stopped at the boundary 22a between the polysilicon film 20c and the top of the oxide film 20b so that part 20c' of polysilicon film 20c remains buried only within the through-holes 29.

Therefore, when the device wafer 20 is polished, the amount of polishing or depth of polishing can be detected from the change of the output signal at the boundary between the different-hardness layers or films which output signal is fed from the strain gauge 10 to the CPU 14. In other words, the relation between the output signal (amount of distortion) of the strain gauge 10 and the amount of polishing in the device wafer 20 is previously stored in the CPU 14, and the actual output signal fed from the strain gauge 10 upon polishing is compared with the data stored in the CPU 14 so that the current amount of polishing can be known.

The arrangement and location of the strain gauges in each of the embodiments are not limited to the above-mentioned examples, but can be variously changed without departing from the scope of the present invention. For example, the number of strain gauges disposed may be one, and the strain gauges may be disposed in an arbitrary manner.

What is claimed is:

1. A method of flattening a semiconductor device by polishing a surface of said semiconductor device, which has at least two different films on a substrate, by chemical mechanical polishing method, comprising the steps of:

detecting abrasion resistance upon polishing by a strain gauge provided close to the surface of said semiconductor device to be polished; and determining an end of a polishing process based on amount of change of a detected signal from said strain gauge.

2. A method according to claim 1, wherein there are a plurality of strain gauges.

3. A method according to claim 2, wherein said plurality of strain gauges are provided in a row.

4. A method according to claim 2, wherein said plurality of strain gauges are provided along a circumference of a circle having an arbitrary radius.

5. A method according to claim 3, wherein said plurality of strain gauges include first strain gauges provided at a certain location on a line, and second strain gauges provided at a different location on said line.

6. A method of flattening a semiconductor device by polishing a surface of said semiconductor device, which has at least two different films on a substrate, by chemical mechanical polishing method, comprising the steps of:
   detecting distortion amount of at least one strain gauge provided close to the surface of said semiconductor device to be polished; and
   determining an end of a polishing process based on amount of change of the distortion amount of said strain gauge.

7. A method according to claim 6, wherein there are a plurality of strain gauges.

8. A method according to claim 7, wherein said plurality of strain gauges are provided in a row.

9. A method according to claim 7, wherein said plurality of strain gauges are provided along a circumference of a circle having an arbitrary radius.

10. A method according to claim 8, wherein said plurality of strain gauges include first strain gauges provided at a certain location on a line, and second strain gauges provided at a different location on said line.

11. A method of flattening a semiconductor device by polishing a surface of the semiconductor device, which has at least two different films on a substrate, by chemical mechanical polishing, the method comprising the steps of:
   detecting distortion amount of a plurality of strain gauges provided at intervals and close to the surface of said semiconductor device to be polished, and
   determining an end of a polishing process based on amount of change of the distortion amount of said plurality of strain gauges.

12. A method according to claim 11, wherein said plurality of strain gages are provided in a row.

13. A method according to claim 12, wherein said plurality of strain gauges include a plurality of first strain gauges provided at a certain location on a line, and a plurality of second strain gauges provided at a different location on said line.

14. A method according to claim 11, wherein said plurality of strain gauges are provided along a circumference of a circle having an arbitrary radius.

15. An apparatus for flattening a semiconductor device by polishing a surface of the semiconductor device, which has at least two different films on a substrate, by chemical mechanical polishing method, wherein:
   said semiconductor device is placed on a rotating table through a polishing cloth, said semiconductor device is driven to rotate, at least one strain gauge is buried to be close to the surface of said semiconductor device to be polished, and a polishing end point is determined by a processor processing an output signal of said strain gauge.

16. An apparatus according to claim 15, wherein said strain gauge is provided in a surface of said rotating table.

17. An apparatus according to claim 15, wherein said strain gauge is provided in said polishing cloth.

18. An apparatus according to claim 15, wherein said strain gauge is provided between said rotating table and said polishing cloth.

19. An apparatus according to claim 16, wherein said rotating table has at least one mounting hole for said strain gauge, said mounting hole being provided at a certain location in the surface of said rotating table.

20. An apparatus according to claim 17, wherein:
   said rotating table has a projection and a depression both of which are formed on a surface of said rotating table;
   said strain gauge is placed on a top of said projection formed on the surface of said rotating table; and
   said polishing cloth has a hole provided at a location associated with said projection.

21. An apparatus according to claim 17, wherein said rotating table has an escape groove provided on a shoulder of said projection of said rotating table.

22. An apparatus according to claim 17, wherein:
   said polishing cloth has an aperture; and
   said apparatus further comprises an elastic support member provided in said aperture, one end of said elastic support member being fixed to the surface of said rotating table, and the other end of said elastic support member being secured to said strain gauge.

23. An apparatus for flattening a semiconductor device by polishing a surface of the semiconductor device, which has at least two different films on a substrate, by chemical mechanical polishing method, said apparatus comprising:
   a rotating table;
   a driving mechanism for driving rotation of said rotating table;
   a polishing cloth provided on said rotating table;
   a plate provided so as to faced said polishing cloth, and having a surface to which said semiconductor device is fixed;
   a working liquid supply mechanism for feeding a working liquid between said polishing cloth and said semiconductor device;
   at least one strain gauge provided close to a surface of said semiconductor device to be polished; and
   a processor for determining an end of a polishing process for said semiconductor device based on a distortion amount of said at least one strain gauge.

24. An apparatus according to claim 23, wherein said strain gauge is provided in a surface portion of said rotating table.

25. An apparatus according to claim 24, wherein said rotating table has a mounting hole for said strain gauge, said mounting hole being provided at a certain location in a surface of said rotating table.

26. An apparatus according to claim 23, wherein said strain gauge is provided in said polishing cloth.

27. An apparatus according to claim 23, wherein said strain gauge is provided between said rotating table and said polishing cloth.

28. An apparatus according to claim 26, wherein:
   said rotating table has a projection and a depression both of which are formed on a surface of said rotating table;
   said strain gauge is placed on a top of said projection formed on the surface of said rotating table; and
   said polishing cloth has a hole provided at a location associated with said one projection.

29. An apparatus according to claim 26, wherein said rotating table has an escape groove provided on a shoulder of said projection of said rotating table.

30. An apparatus according to claim 26, wherein:
   said polishing cloth has an aperture; and said apparatus further comprises an elastic support member provided in said aperture, one end of said elastic support member being fixed to the surface of said rotating table, and the other end of said elastic support member being secured to said strain gauge.

31. An apparatus for flattening a semiconductor device by polishing a surface of the semiconductor device, which has at least two different films on a substrate, by chemical mechanical polishing method, said apparatus comprising:

a rotating table;

a driving mechanism for driving rotation of said rotating table;

a polishing cloth provided on said rotating table;

a plate provided so as to faced said polishing cloth, and having a surface to which said semiconductor device is fixed;

a working liquid supply mechanism for feeding a working liquid between said polishing cloth and said semiconductor device;

a plurality of strain gauges provided close to a surface of said semiconductor device to be polished; and a processor for determining an end of a polishing process for said semiconductor device based on distortion amount of said plurality of strain gauges.

32. An apparatus according to claim 31, wherein said plurality of strain gauges are provided in a row.

33. An apparatus according to claim 31, wherein said plurality of strain gauges include first strain gauges provided at a certain location on a line, and second strain gauges provided at a different location on said line.

34. An apparatus according to claim 31, wherein said plurality of strain gauges are provided along a circumference of a circle having an arbitrary radius.

35. An apparatus according to claim 31, wherein said plurality of strain gauges are provided in said polishing cloth.

36. An apparatus according to claim 31, wherein said plurality of strain gauges are provided in a surface portion of said rotating table.

37. An apparatus according to claim 31, wherein said plurality of strain gauges are provided between said rotating table and said polishing cloth.

38. An apparatus according to claim 35, wherein said rotating table has a plurality of mounting holes for said plurality of strain gauges, said plurality of mounting holes being provided at a certain location in a surface of said rotating table.

39. An apparatus according to claim 36, wherein:

said rotating table has a plurality of projections and a plurality of depressions both of which are formed on a surface of said rotating table;

each of said plurality of strain gauges is placed on a top of each of said plurality of projections formed on the surface of said rotating table; and said polishing cloth has a plurality of holes provided at a location associated with said plurality of projections.

40. An apparatus according to claim 36, wherein said rotating table has a plurality of escape grooves each of which is provided on a shoulder of each of said projections of said rotating table.

41. An apparatus according to claim 36, wherein:

said polishing cloth has a plurality of apertures; and said apparatus further comprises a plurality of elastic support members provided in said apertures, each of one ends of said plurality of elastic support members being fixed to the surface of said rotating table, and each of the other ends of said plurality of elastic support members being secured to each of said plurality of strain gauges.

\* \* \* \* \*